(12) United States Patent
Kawamoto

(10) Patent No.: US 11,508,570 B2
(45) Date of Patent: Nov. 22, 2022

(54) SIC FILM STRUCTURE

(71) Applicant: ADMAP INC., Tamano (JP)

(72) Inventor: Satoshi Kawamoto, Tamano (JP)

(73) Assignee: ADMAP INC., Tamano (JP)

( * ) Notice: Subject to any disclaimer, the term of this patent is extended or adjusted under 35 U.S.C. 154(b) by 73 days.

(21) Appl. No.: 16/498,249

(22) PCT Filed: Aug. 28, 2019

(86) PCT No.: PCT/JP2019/033684
§ 371 (c)(1),
(2) Date: Sep. 26, 2019

(87) PCT Pub. No.: WO2020/174725
PCT Pub. Date: Sep. 3, 2020

(65) Prior Publication Data
US 2021/0005491 A1 Jan. 7, 2021

(30) Foreign Application Priority Data

Feb. 28, 2019 (JP) .............................. JP2019-036720

(51) Int. Cl.
*B32B 9/00* (2006.01)
*H01L 21/02* (2006.01)
(Continued)

(52) U.S. Cl.
CPC ........ *H01L 21/02167* (2013.01); *C23C 16/01* (2013.01); *C23C 16/325* (2013.01);
(Continued)

(58) Field of Classification Search
CPC ......... B32B 9/00; Y19T 428/30; B82Y 30/00; Y10T 428/30
(Continued)

(56) References Cited

U.S. PATENT DOCUMENTS 3,734,705 A 5/1973 Fincham
4,400,232 A * 8/1983 Ownby .................. C30B 15/04
117/15

(Continued)

FOREIGN PATENT DOCUMENTS

JP S47035638 11/1972
JP S577923 A 1/1982
(Continued)

OTHER PUBLICATIONS

Jul. 23, 2019 Office Action issued in Japanese Patent Application No. 2019-120825.
(Continued)

*Primary Examiner* — Daniel H Miller
(74) *Attorney, Agent, or Firm* — Oliff PLC

(57) ABSTRACT

A SiC film structure for obtaining a three-dimensional SiC film by forming the SiC film in an outer circumference of a substrate using a vapor deposition type film formation method and removing the substrate, the SiC film structure including: a main body having a three-dimensional shape formed of a SiC film and having an opening for removing the substrate; a lid configured to cover the opening; and a SiC coat layer configured to cover at least a contact portion between the main body and an outer edge portion of the lid and join the main body and the lid.

8 Claims, 3 Drawing Sheets

(51) Int. Cl.
*H01L 21/50* (2006.01)
*C23C 16/01* (2006.01)
*C23C 16/32* (2006.01)
*H01L 21/673* (2006.01)

(52) U.S. Cl.
CPC ........ *H01L 21/02271* (2013.01); *H01L 21/50* (2013.01); *H01L 21/67366* (2013.01)

(58) Field of Classification Search
USPC .......................................................... 428/408
See application file for complete search history.

(56) References Cited

U.S. PATENT DOCUMENTS

| | | | |
|---|---|---|---|
| 5,494,524 A | | 2/1996 | Inaba et al. |
| 5,584,936 A | * | 12/1996 | Pickering ............ C23C 16/4583 118/500 |
| 9,612,215 B2 | | 4/2017 | Fujita et al. |
| 2002/0173125 A1 | | 11/2002 | Takeda et al. |
| 2010/0032857 A1 | | 2/2010 | Izadnegahdar et al. |

FOREIGN PATENT DOCUMENTS

| | | |
|---|---|---|
| JP | H05-90184 A | 4/1993 |
| JP | H06-188306 A | 7/1994 |
| JP | 2001-158666 A | 6/2001 |
| JP | 2002-289537 A | 10/2002 |
| JP | 2008-034729 A | 2/2008 |

OTHER PUBLICATIONS

Jun. 11, 2020 Notice of Allowance issued in U.S. Appl. No. 16/664,013.

* cited by examiner (A)

(B)

(C)

(D)

(E)

(F)

SIC FILM STRUCTURE

FIELD OF THE INVENTION

The present invention relates to a SiC film formation technology, and more particularly, to a three-dimensional structure formed of a SiC film.

BACKGROUND OF THE INVENTION

Due to its excellent environmental resistance and high chemical stability, especially in the field of semiconductor device manufacturing, demands for a single-film structure formed of SiC as a tool used at a very high temperature, such as a wafer boat or tube and a dummy wafer, in semiconductor manufacturing, are increasing.

A structure formed of such a SiC film (hereinafter, referred to as a "SiC film structure") can be used to manufacture a three-dimensional shape as well as a planar shape. As a specific manufacturing method thereof, for example, the technique discussed in Patent Document 1 is known in the art. In the manufacturing method of the SiC film structure discussed in Patent Document 1, first, a substrate formed of carbon (graphite) or the like is fabricated. Then, a SiC film is formed on a surface of the substrate using a chemical vapor deposition (CVD) method.

Then, the substrate is burned out by heating the substrate subjected to the deposition under a high-temperature oxidation atmosphere. By performing the substrate removal through such a process, it is possible to obtain a SiC film structure in which the substrate can be removed even when the structure has a complicated three-dimensional shape which may make it difficult to remove the substrate through mechanical machining.

CITATION LIST

Patent Documents

Patent Document 1: Japanese Unexamined Patent Application Publication No. 2001-158666

SUMMARY OF THE INVENTION

For a SiC film structure formed in this manner with a three-dimensional shape, it is necessary to form the SiC film partially or entirely on the surface of the substrate and remove the substrate. However, in order to remove the substrate, it is necessary to prepare an oxidation hole for exposing a part of the substrate. Therefore, it is difficult to provide perfect sealing in the SiC film structure.

If such an oxidation hole remains in the SiC film structure configured as a product, moisture such as a chemical solution may intrude during cleaning or the like, which may generate a portion suffering from difficulty in drying.

In this regard, an object of the present invention is to address the aforementioned problems and provide a SiC film structure capable of providing a sealing structure.

In order to achieve the aforementioned object, according to the present invention, there is provided a SiC film structure for obtaining a three-dimensional SiC film by forming a SiC film in an outer circumference of a substrate using a vapor deposition type film formation method and removing the substrate, the SiC film structure including: a main body having a three-dimensional shape formed of a SiC film and having an opening for removing the substrate; a lid configured to cover the opening; and a SiC coat layer configured to cover at least a contact portion between the main body and an outer edge portion of the lid and join the main body and the lid.

In the SiC film structure described above, it is preferable that the lid is formed of a SiC film. Accordingly, it is possible to form the SiC film structure as a SiC single-film structure. In addition, since the thermal expansion coefficients can match between the main body and the lid, it is possible to prevent distortion caused by a temperature change.

In the SiC film structure described above, it is preferable that the lid has a boss portion fitted to the opening and a flange portion overhanging to an outer circumference of the boss portion to cover the opening. Accordingly, it is possible to easily position the lid and seal the opening even when the structure is miniaturized.

Using the SiC film structure described above, it is possible to obtain a sealing structure without any opening in the main body having a three-dimensional shape.

DESCRIPTION OF EMBODIMENTS

A SiC film structure according to an embodiment of the invention will now be described in details with reference to the accompanying drawings. Note that the following embodiments are a part of preferable modes for embodying the invention, and even some modifications for a part of the configuration may be regarded as a part of the invention as long as a specific requirement of the invention is satisfied.

<Configuration>

Figure 1:
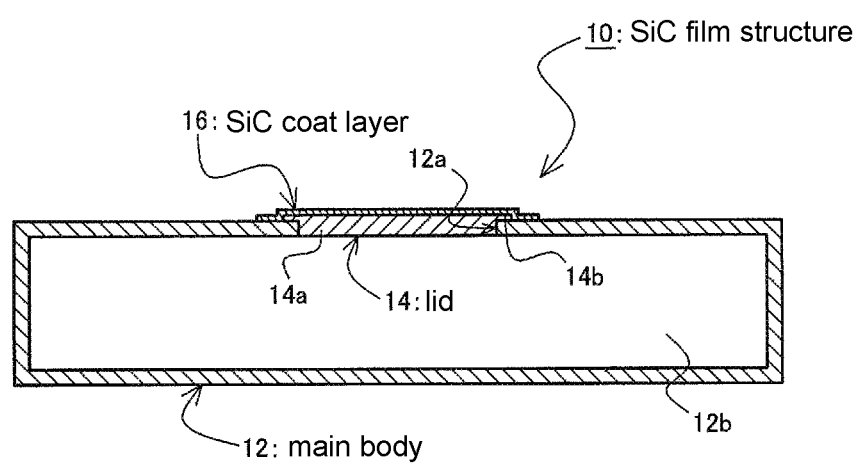
FIG. 1 is a diagram illustrating a configuration of a SiC film structure according to an embodiment of the invention.

According to this embodiment, the SiC film structure 10 basically includes a main body 12, a lid 14, and a SiC coat layer 16 as illustrated in FIG. 1. The main body 12 is a hollow member having a three-dimensional shape and has an opening 12a at least in a part thereof. The opening 12a is provided to communicate with the hollow portion 12b. Note that the main body 12 is formed of a SiC (silicon carbide) film.

The lid 14 is an element for sealing the opening 12a provided in the main body 12. In the example of FIG. 1, the lid has a boss portion 14a and a flange portion 14b. The boss portion 14a is an element fitted to the opening 12a provided in the main body 12 for positioning, and the flange portion 14b is an element overhanging from one end side of the boss portion 14a to an outer circumference of the boss portion 14a to cover the opening 12a. Due to the flange portion 14b, it is possible to prevent the boss portion 14a from falling to the inside of the main body 12. For this reason, there is no problem even when a clearance between the boss portion 14a and the opening 12a slightly increases. In addition, it is not necessary to prepare treatment or the like for improving accuracy.

The lid 14 may be formed of any material without a particular limitation. Preferably, the lid 14 is formed of a member having resistance to temperature, chemicals, or the like, that is, high environmental resistance. Note that, according to this embodiment, the lid 14 is formed of SiC. As a result, the SiC film structure 10 can be formed as a SiC single-film structure. If the lid 14 is formed of the same member as that of the main body 12, there is no possibility of causing distortion or the like caused by a difference in thermal expansion coefficient even under a high-temperature or low-temperature environment.

The SiC coat layer 16 is an element that joins the main body 12 and the lid 14. For this reason, the SiC coat layer 16 is formed to cover at least a contact portion between the main body 12 and an outer edge portion of the lid 14. In the configuration of FIG. 1, the SiC coat layer 16 is formed to cover a surface of the flange portion 14b formed on the lid 14 and cover the main body 12 positioned in the outer circumference of the flange portion 14b.

In the SiC film structure 10 having the aforementioned configuration, it is possible to obtain a perfect sealing structure even in a three-dimensional shape formed of the SiC film. As a result, even when cleaning or the like is performed for the SiC film structure 10, it is possible to prevent a chemical solution or the like from intruding to the inside, which may make cleaning or drying difficult.

<Manufacturing Process>

Figure 2:
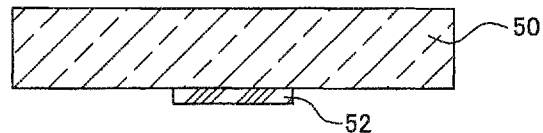
FIGS. 2A to 2F are diagrams for describing a manufacturing method of the SiC film structure according to an embodiment of the invention.
Figure 2:
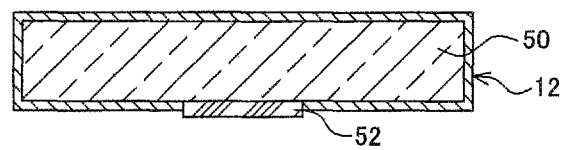
Figure 2:
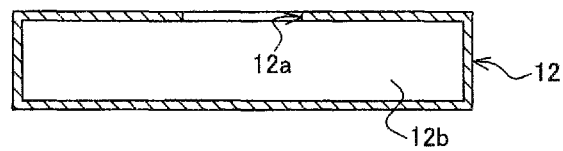
Figure 2:
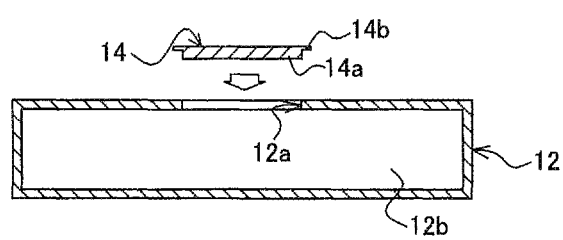
Figure 2:
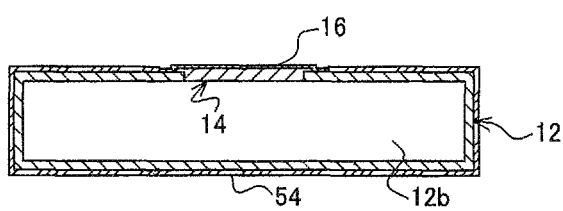
Figure 2:
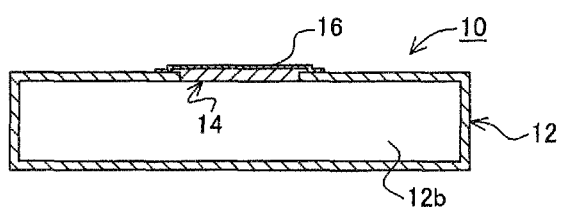

A manufacturing process of the SiC film structure 10 according to this embodiment will be described with reference to FIGS. 2A to 2F. First, as illustrated in FIG. 2A, a substrate 50 having a three-dimensional shape is formed. There is no particular limitation in the shape of the substrate 50. Note that, in the example of FIG. 2A, the substrate 50 is illustrated as a rectangular shape for easy description. The substrate 50 is preferably formed of a material that can be relatively easily removed through heating or using chemicals, such as graphite or silicon. According to this embodiment, graphite is employed as a material of the substrate 50 because it can be burned out by heating under a high-temperature oxidation atmosphere. Note that a masking 52 for forming the opening 12a is applied to at least a part of the substrate 50.

Then, as illustrated in FIG. 2B, the SiC film of the main body 12 is formed on the surface of the substrate 50 through a vapor deposition type film formation method. Note that the vapor deposition type film formation method may include, for example, a chemical vapor deposition (CVD) method. Alternatively, the vapor deposition type film formation method may include a vacuum type physical vapor deposition (PVD) method, a molecular beam epitaxy (MBE) method, or the like, but not limited thereto. There is no particular limitation in the film thickness of the SiC film. However, it is necessary to provide a film thickness by which the SiC film has a self-supporting strength as a three-dimensional structure when the substrate 50 is removed.

After forming the SiC film in an outer circumference of the substrate 50, a part of the substrate 50 is exposed by removing the masking 52 as illustrated in FIG. 2C. Then, the substrate 50 subjected to the deposition is removed by heating under a high-temperature oxidation atmosphere. If the substrate 50 is formed of graphite as in this embodiment, the substrate 50 is burned out as carbon dioxide.

After removing the substrate 50, the lid 14 is placed in the opening 12a of the main body 12 as illustrated in FIG. 2D. Note that the process of forming the lid 14 may be performed separately from, before/after, or in parallel with the process of forming the main body 12.

After placing the lid 14 in the opening 12a, a masking 54 is applied to the outer circumference of the main body 12 so as to slightly expose the main body 12 to the outer circumference of the flange portion 14b of the lid 14 as illustrated in FIG. 2E. After the masking 54 is applied, SiC is deposited so as to cover the lid positioned in the opening of the masking and the exposed portion of the main body in order to form a SiC coat layer. The process of forming the SiC coat layer may be performed similarly to the film formation process of FIG. 2B. Note that the processes of FIGS. 2D to 2E may be performed in the air or under a vacuum atmosphere. In addition, the lid 14 may be sealed after replacing the internal gas with an inert gas or the like in a furnace. Note that, when the internal gas of the main body 12 is degassed or replaced under the unmanned environment, the operation may be performed by interposing a spacer (not shown) or the like between the opening 12a and the lid 14. If the spacer is formed of a material that is burned out by heating, such as silicon, the spacer is removed in the film formation process after degassing or replacement. For this reason, a gap provided for degassing or replacement is removed, and the opening 12a is sealed.

By removing the masking 54 after completing joining and sealing between the lid 14 and the main body 12 using the SiC coat layer as illustrated in FIG. 2F, the SiC film structure 10 is finally obtained.

<Modifications>

Figure 3:
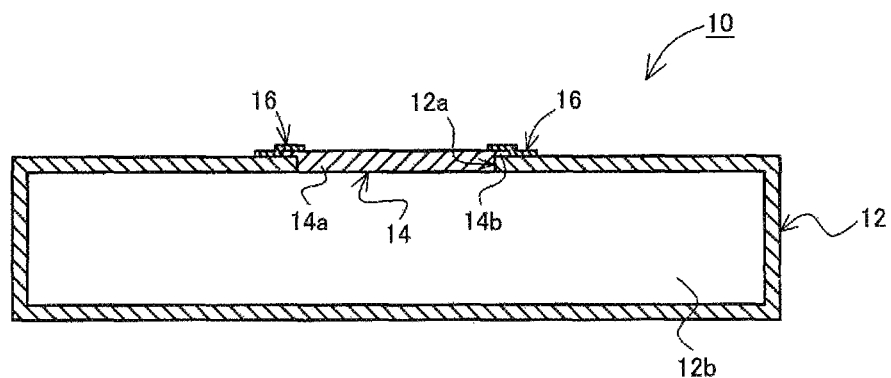
FIG. 3 is a diagram illustrating a SiC film structure according to a first modification.

In the aforementioned embodiment, the SiC coat layer 16 is formed to entirely cover the lid 14 when the opening 12a of the main body 12 is sealed with the lid 14. However, the SiC coat layer 16 may be configured to cover a contact portion between the main body 12 and the outer edge portion of the lid 14. That is, as illustrated in FIG. 3, the SiC coat layer 16 may be placed on the outer circumference without providing the SiC coat layer 16 in the vicinity of the center of the lid 14. This is because the opening 12a of the main body 12 is sealed even in this configuration.

Figure 4:
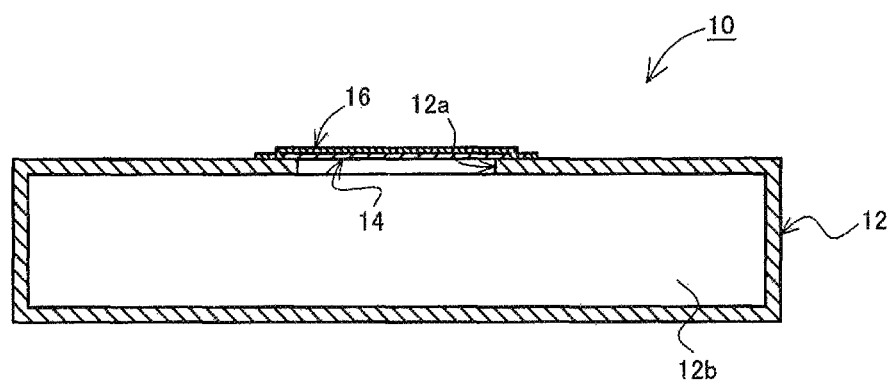
FIG. 4 is a diagram illustrating a SiC film structure according to a second modification.

In the aforementioned embodiment, the lid 14 has the boss portion 14a and the flange portion 14b, and the boss portion 14a is fitted to the opening 12a for positioning of the lid 14. However, the lid 14 may have any configuration as long as the opening 12a of the main body 12 can be sealed. For this reason, the lid 14 may be formed as a flat plate as illustrated in FIG. 4. The function of the lid 14 can be achieved as long as it can cover the opening 12a.

REFERENCE SIGNS LIST

10 SiC film structure,
12 main body,
12a opening,
12b hollow portion,
14 lid,
14a boss portion,
14b flange portion,
16 SiC coat layer,
50 substrate,
52 masking,
54 masking.

What is claimed is:

1. A SiC film structure formed by depositing a SiC film on a surface of a substrate through a vapor deposition type film formation method, the SiC film having an opening, and removing the substrate from the opening after the SiC film has been deposited, the SiC film structure comprising:

a main body of a hollow member having a three-dimensional shape formed of the SiC film and the opening;
a lid configured to cover the opening; and
a SiC coat layer configured to cover at least a contact portion between the main body and an outer edge portion of the lid and join the main body and the lid,
wherein the lid is sealed to the main body.

2. The SiC film structure according to claim 1, wherein the lid is formed of a SiC film.

3. The SiC film structure according to claim 1, wherein the lid has a boss portion fitted to the opening and a flange portion overhanging to an outer circumference of the boss portion to cover the opening.

4. The SiC film structure according to claim 2, wherein the lid has a boss portion fitted to the opening and a flange portion overhanging to an outer circumference of the boss portion to cover the opening.

5. The SiC film structure according to claim 1, wherein the SiC coat layer is configured to entirely cover the lid.

6. The SiC film structure according to claim 2, wherein the SiC coat layer is configured to entirely cover the lid.

7. The SiC film structure according to claim 1, wherein the lid is formed as a flat plate.

8. The SiC film structure according to claim 2, wherein the lid is formed as a flat plate.

* * * * *